United States Patent
Kagan et al.

(10) Patent No.: US 8,686,404 B2
(45) Date of Patent: Apr. 1, 2014

(54) ORGANIC SEMICONDUCTORS CAPABLE OF AMBIPOLAR TRANSPORT

(75) Inventors: Cherie Kagan, Bala Cynwyd, PA (US); Sangameshwar Rao Saudari, Philadelphia, PA (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 181 days.

(21) Appl. No.: 13/133,189

(22) PCT Filed: Dec. 8, 2009

(86) PCT No.: PCT/US2009/067111
§ 371 (c)(1),
(2), (4) Date: Aug. 12, 2011

(87) PCT Pub. No.: WO2010/068619
PCT Pub. Date: Jun. 17, 2010

(65) Prior Publication Data
US 2012/0018706 A1    Jan. 26, 2012

Related U.S. Application Data

(60) Provisional application No. 61/120,697, filed on Dec. 8, 2008.

(51) Int. Cl.
*H01L 29/786* (2006.01)
*H01L 51/00* (2006.01)

(52) U.S. Cl.
USPC .................. 257/40; 257/351; 257/E29.275

(58) Field of Classification Search
USPC .................. 438/158; 257/40, 351, E29.275
See application file for complete search history.

(56) References Cited

U.S. PATENT DOCUMENTS

| | | |
|---|---|---|
| 6,180,956 B1 | 1/2001 | Chondroudis |
| 6,284,562 B1 | 9/2001 | Batlogg |
| 6,335,539 B1 | 1/2002 | Dimitrakopoulos |
| 6,429,040 B1 | 8/2002 | Bao |
| 6,521,489 B2 | 2/2003 | Duthaler |
| 6,528,816 B1 | 3/2003 | Jackson |
| 6,569,707 B2 | 5/2003 | Dimitrakopoulos |
| 6,870,181 B2 | 3/2005 | Zhang |
| 7,265,380 B2 | 9/2007 | Kawai |
| 7,285,440 B2 | 10/2007 | Dimitrakopoulos |
| 7,297,977 B2 | 11/2007 | Hoffman |
| 7,339,187 B2 | 3/2008 | Wager, III et al. |
| 7,411,868 B2 | 8/2008 | Kohmoto |
| 2002/0045289 A1 | 4/2002 | Dimitrakopoulos |
| 2005/0208400 A1 | 9/2005 | Nishikawa |
| 2007/0278478 A1 | 12/2007 | Zaumseil |
| 2008/0099758 A1 | 5/2008 | Lee |
| 2008/0318157 A1 | 12/2008 | Afzali-Ardankani |
| 2009/0101892 A1 | 4/2009 | Dimitrakopoulos |

FOREIGN PATENT DOCUMENTS

| | | |
|---|---|---|
| WO | 2004085346 | 10/2004 |
| WO | 2004086458 | 10/2004 |

OTHER PUBLICATIONS

International Search Report dated Jan. 28, 2010, application No. PCT/US09/67111.

*Primary Examiner* — Zandra Smith
*Assistant Examiner* — Toniae Thomas
(74) *Attorney, Agent, or Firm* — RatnerPrestia

(57) ABSTRACT

Electrodes in an organic thin film transistor based on single component organic semiconductors may be chemically modified to realize ambipolar transport. Electronic circuits may be assembled which include at least two such organic thin film transistors wherein at least one transistor is configured as a pmos transistor and at least on other transistor is configured as a nmos transistor.

17 Claims, 14 Drawing Sheets

ORGANIC SEMICONDUCTORS CAPABLE OF AMBIPOLAR TRANSPORT

CROSS REFERENCE TO RELATED APPLICATIONS

This is a National Phase application of PCT application number PCT/US2009/067111, filed Dec. 8, 2009, which claims priority benefit of U.S. provisional application No. 61/120,697, filed Dec. 8, 2008, the content of such applications being incorporated herein by reference.

FIELD OF THE INVENTION

The invention relates to electronic circuits containing thin film transistors based on organic semiconductors that are capable of realizing ambipolar transport.

DISCUSSION OF THE RELATED ART

Ambipolar transport in organic semiconductors has attracted considerable attention for numerous applications of organic complementary metal-oxide semiconductor (CMOS)-like devices in low cost and flexible electronics and in light-emitting and photosensing field-effect transistors (FETs). However, organic semiconductors are commonly classified as either n-type or p-type, as different materials have typically shown unipolar behavior in FETs with, for example, either exclusively electron transport with mobilities of ~$10^{-3}$-$10^{-1}$ cm$^2$/V s in arylene diimides or hole transport with mobilities of ~1 cm$^2$/V s in pentacene. Several research groups have reported ambipolar organic FETs by fabricating bilayers or blends combining an n-type and a p-type organic semiconductor. Recent reports have established that ambipolar transport is an intrinsic property of organic semiconductors. In many organic thin film semiconductors which were known to be hole conductors, including pentacene, the absence or poor transport of electrons has been attributed to extrinsic factors: (i) high injection barriers for electrons at the metal-semiconductor interface; (ii) electron traps at the dielectric-semiconductor interface; and (iii) electron trap generation upon exposure to different environments.

Fabricating ambipolar FETs having a single organic semiconductor channel material is much simpler compared to bilayers and blends. Single-component ambipolar organic FETs were achieved employing low work function source and drain electrodes or one low work function metal for electron injection and one high work function metal for hole injection. The drawbacks of these structures are (i) the poor stability of the low work function electrodes and (ii) two different metals require multiple angled depositions or lithography/masking steps. Ambipolar transport has been reported in low bandgap organic semiconductors using Au electrodes, but these materials have low mobility. Ambipolar transport in vacuum deposited pentacene FETs using a polyvinyl alcohol dielectric and Au electrodes has been reported, wherein the ambipolar character has been attributed to the small grain structure uniquely formed on this dielectric.

SUMMARY OF THE INVENTION

It has now been unexpectedly discovered that modifying the metallic (e.g. gold) electrodes in an organic thin film transistor (OTFT), such as a pentacene-based OTFT, with organic compounds such as aliphatic and aromatic thiols permits the production of OTFT devices exhibiting 1) both hole transport and electron transport (p and n type); 2) improved transport for both n- and p-type transport (as compared to analogous devices with non-modified electrodes); and 3) the potential to tailor the transport based on the type of compound used to modify the electrodes. Depending upon the polarity of the gate voltage, the organic thin film semiconductor component of the transistor can be operated as either an n-type or p-type semiconductor. Prior to deposition of the organic semiconductor, the organic compounds (e.g., aromatic or aliphatic thiols) self-assemble on the gold or other metal source and drain electrodes of the transistor. This approach has advantages from mass-production and cost standpoints and has the potential to be extended to many other organic semiconductor based OTFTs. Additional advantages include easy integration into mass-production of OTFTs, opening up many more ambipolar organic semiconductors for applications including organic light emitting field effect transistors and organic photodetectors.

In one aspect of the invention, an electronic circuit is provided which comprises a first organic thin film transistor and a second organic thin film transistor. These transistors are operatively connected and provided on a common substrate, wherein each of the first organic thin film transistor and second organic thin film transistor includes bottom source/drain electrodes having an organic semiconductor formed over the bottom source/drain electrodes. The bottom source/drain electrodes have a self-assembled monolayer formed thereon, wherein the self-assembled monolayer comprises at least one organic compound. The self-assembled monolayer enhances charge injection at the metal-organic interface. The first organic thin film transistor and second organic thin film transistor exhibit ambipolar transport such that one of the first and second transistors is configured as a pmos transistor and the other one of the first and second transistors is configured as an nmos transistor. The degree of improvement of n-type transport, in particular, varies with the type of organic compound monolayer used.

Each of the ambipolar field-effect transistors present in such an electronic circuit may be comprised of a source region and a drain region, with a channel layer extending between the source region and the drain region and a gate region disposed in spaced adjacency to the channel layer between the source region and the drain region. A self-assembled monolayer is disposed adjacent to the source region and the drain region; the self-assembled monolayer is comprised of an organic compound. The channel region includes an organic semiconductor material. An electrically insulating layer is present between the gate region, the drain region, and the channel layer.

Both p type and n type semiconductors are required to build CMOS (complementary metal oxide semiconductor) circuits. In traditional Si CMOS electronics, PMOS and NMOS circuits are fabricated in a multi-step lithography process from Si doped with III group and V group elements respectively. However, organic CMOS structures are currently fabricated from 1) bilayers, 2) blends incorporating n-type and p-type semiconductors, or 3) a single component ambipolar semiconductor. The examples of the present invention described herein have the potential to be simpler and to maintain the low cost advantage of organic-based electronics. A single homogeneous semiconductor layer may be used in each of the plurality of thin film transistors in an electronic circuit, eliminating the need, as in conventional devices, for separate n-type and p-type materials.

DETAILED DESCRIPTION OF CERTAIN EMBODIMENTS OF THE INVENTION

The example electronic circuits of the present invention include at least a first organic thin film transistor and a second organic thin film transistor. These transistors, which may be identical or different in structure, are operatively connected and provided on a common substrate.

Each of the ambipolar field-effect transistors present in such an electronic circuit may be comprised of a source region (including a source electrode) and a drain region (including a drain electrode), with a channel layer extending between the source region and the drain region and a gate region disposed in spaced adjacency to the channel layer between the source region and the drain region. A self-assembled monolayer is disposed adjacent to the source region and the drain region; the self-assembled monolayer is comprised of an organic compound. The channel region includes an organic semiconductor material. An electrically insulating layer is present between the gate region, the drain region, and the channel layer. The individual transistors may be configured or modified as may be desired so as to suit a particular electronic circuit application; the following descriptions of certain basic transistor structures are illustrative only. Other standard thin film transistor structures known in the art may be adapted for use in the present invention; such structures should, however, be modified to contain a self-assembled monolayer of an organic compound at the electrode-semiconductor interface as described herein so as to render the transistor capable of realizing ambipolar transport.

Figure 1:
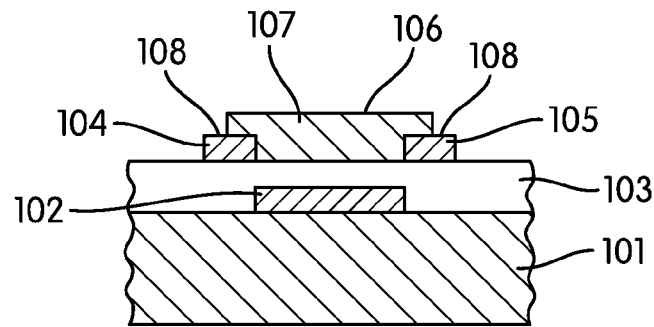
FIGS. 1-3 show various basic transistor structures that can be utilized in the example electronic circuits of the present invention.
Figure 2:
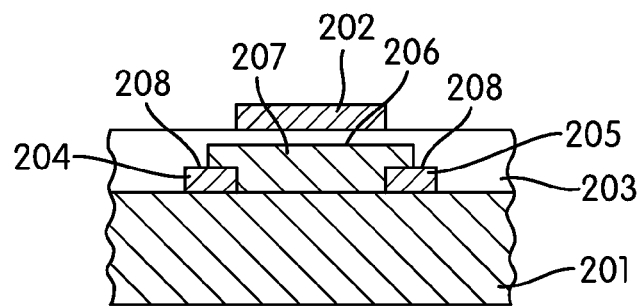

A first basic thin film transistor structure is shown in FIG. 1. Such structure is comprised of a substrate 101 having a gate 102 formed on a surface of substrate 101. The structure shown in FIG. 2 is further comprised of a gate insulator 103 that is formed on top of gate 102. A source region (e.g., source electrode) 104 and a drain region (e.g., drain electrode) 105 are present on gate insulator 103. A self-assembled monolayer 108 comprised of at least one organic compound is present on at least a portion of the source region 104 and drain region 105. An organic thin film semiconductor 106 is placed thereover so as to bridge between source region 104 and drain region 105, thereby providing a channel region 107 extending between the source region 104 and drain region 105. The organic thin film semiconductor 106 thus is in contact with both source region 105 and drain region 105 (with a self-assembled monolayer comprised of at least one organic compound such as a thiolate present at the organic thin film semiconductor/electrode interface). A self-assembled monolayer of at least one organic compound thus is positioned at the interface between source region 104 and organic thin film semiconductor 106 as well as at the interface between drain region 105 and organic thin film semiconductor 106.

A second basic thin film transistor structure is shown in FIG. 2. Source region 204 and drain region 205 are formed on substrate 201. A self-assembled monolayer 208 is then formed on at least a portion of the surface of each of source region 204 and drain region 205. An organic thin film semiconductor 206 is deposited or otherwise formed over source region 204 and drain region 205 to provide a channel region 207 extending between source region 204 and drain region 205. Gate insulator 203 is then placed over the structure, followed by gate 202.

Figure 3:
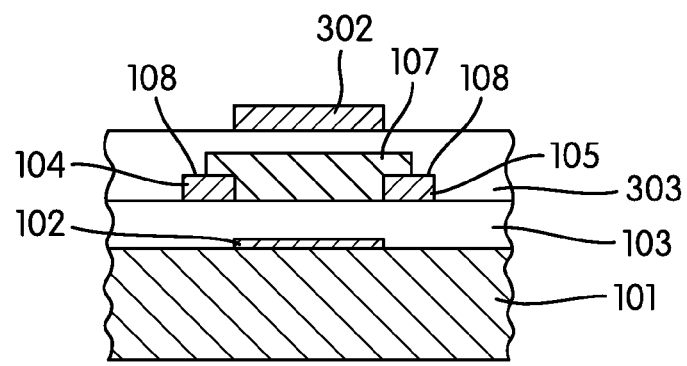

A third basic thin film transistor structure is shown in FIG. 3. This structure has a dual gate structure, wherein a second gate insulator 303 is placed over the single gate structure shown in FIG. 1 and then a top gate 302 is formed. Organic thin film semiconductor 106 thus has a gate both above and below it. Top gate 302 may be electrically connected to gate 102, source region 104 and/or drain region 105, for example by way of vias (not shown) extending through second gate insulator 303, organic thin film semiconductor 106 (provided such vias are insulated from the semiconductor) and/or gate insulator 103. If so desired, top gate 302 may be encapsulated by an encapsulant layer (not shown) comprised of a suitable dielectric material.

In CMOS circuit design, pmos and nmos devices are typically connected in series between a source of operational voltage (e.g., $V_{CC}$) and a source of reference potential (e.g. ground). This configuration minimizes steady-state current as either the pmos or nmos transistor will be turned off.

Any two of the field effect transistor (FET) devices described above can be combined to form an electronic circuit, with one of the transistors being configured as a pmos transistor and the other transistor being configured as an nmos transistor. The incorporation of the self-assembled organic compound monolayer at the interface between the source and drain regions and the organic thin film semiconductor layer imparts ambipolar characteristics to such transistors.

Suitable substrates that can be employed in the example embodiments of the present invention include, but are not limited to: Si-containing substrates such as Si, $SiO_2$, $SiO_2$/Si, SiGe, silicon-on-insulators and glass and Al-containing substrates such as sapphire and $Al_2O_3$; organic materials, including polymers, particularly plastics such as polyethylene terphthalate (PET) and other polyesters, polyimide, polysilicones, polyacrylates and polycarbonate; inorganic materials such as diamond, diamond-like carbon (amorphous diamond), interconnect structures and metal layers; and mixtures thereof. The substrate may also be a circuit board or laminate. One type of substrate that can be employed is a Si wafer (heavily doped) in which a thermally grown $SiO_2$ layer (which can serve as a common gate dielectric) is present therein.

In one embodiment of the invention, the substrate employed is an $SiO_2$-containing substrate that is coated with benzocyclobutene (BCB) or the like. Burying an $SiO_2$ gate dielectric with benzocyclobutene provides a dielectric stack, which eliminates the $SiO_2$ surface sites believed to act as electron traps at the dielectric-semiconductor interface. The BCB can help to prevent electron trapping at the organic-dielectric interface.

The substrate may contain various active device regions and/or isolation regions either on the surface thereof or in the substrate itself. For example, the substrate may contain source/drain regions, shallow trench isolation regions, field oxide regions, metallization layers, dielectric layers and other like layers that are typically present in transistor structures.

The gates may be composed of any of the conventional gate conductors that are well known to those skilled in the art. For example, the gates can contain a conductive metal such as aluminum, gold, silver, tungsten, copper or chromium, or, alternatively, doped single crystalline Si or polysilicon, conductive carbon (e.g., carbon nanotubes) or an organic conductor such as polyaniline or poly(3,4-ethylenedioxythiophene):polystyrene sulfonate (PEDOT:PSS) can be used as the gate conductor. In one embodiment, gates containing n-doped single crystalline Si are utilized. The gates are formed by first depositing or growing the gate material and then patterning the same using conventional lithography and etching. Conventional deposition processes that can be used in forming the gate include, but are not limited to: chemical vapor deposition, plasma-assisted chemical vapor deposition, sputtering, evaporation, electroplating, electroless plating or other like deposition processes may be employed. The gate conductor may also be deposited by printing processes such as ink-jet, gravure or screen print techniques. Spin-coating or lamination processes may also be employed. When polysilicon or single crystal Si is used, the doping may take place during the deposition process using an in-situ process or after, using ion implantation and annealing.

The gate insulators may be comprised of any of the conventional dielectric materials well known to those skilled in the art. For example, the gate insulators may comprise an organic dielectric material such as polyimides, polyamides, parylenes, polymethylmethacrylate and other polyacrylates, benzocyclobutene, polyvinyl alcohol and other like organic materials or an inorganic dielectric material such as $Si_3N_4$, $SiO_2$, perovskite-type oxides and other like inorganic materials. The gate insulators may be formed using conventional processes well known to those skilled in the art, including any of the previous mentioned deposition processes used in forming the gates. In one embodiment, $SiO_2$ (including $SiO_2$ coated with benzocyclobutene) is utilized.

The electrodes which are present in the source and drain regions may be composed of a conductive metal, metal alloy, metal oxide or metal oxide alloy that contains at least one metal that is highly conductive. Such conductive metals are well known to those skilled in the art and include, for example, platinum (Pt), palladium (Pd), aluminum (Al), gold (Au), tungsten (W), chromium (Cr) or titanium (Ti). Two or more different materials may be employed within an individual electrode. However, in one embodiment of the invention, a single conductive material is utilized within an individual electrode. Additionally, this single conductive material may be used for all the electrodes within a single device or electronic circuit according to the present invention. The electrodes within a single transistor may differ in composition. The electrodes may be single layered or comprise a stack of two or more metal layers, i.e. a metal stack of Cr and Au, with Au on top, or Ti and Pt, with Pt on top. In one embodiment, a high work function metal is present at the interface between the electrode and the organic semiconductor (i.e., the electrode surface on which the self-assembled monolayer of organic compound is deposited is comprised of a high work function metal such as gold or platinum). The electrode (unpatterned) is formed using conventional deposition processes such as evaporation, chemical vapor deposition, plasma-assisted chemical vapor deposition, sputtering, electroplating or electroless plating or by a lamination method, and a patterned electrode is provided by conventional lithography and etching. Alternatively, a shadow mask may be used in forming the patterned electrodes.

The organic semiconductor layers present in the thin film transistors utilized in the example electronic circuits of the present invention may be comprised of any organic semiconductor material. In one aspect of the invention, only a single type of organic semiconductor material is employed; fabrication of the example electronic circuits thus can be simplified as compared to known technologies which rely on a plurality of semiconductor materials to achieve satisfactory performance. An organic semiconductor is any organic material that has semiconductor properties. A semiconductor is any compound or substance whose electrical conductivity is between that of typical metals and that of insulating materials. Any of the known organic semiconducting materials (including small molecule, oligomeric and polymeric substances) may be used in embodiments of the present invention including, but not limited to, acenes such as tetracene and pentacene and substituted derivatives thereof as well as other fused aromatic ring structures, anthracene, rubrene, diiindeneoperylene, arylenediimides, perylenediimides, tetracyanoquinodimethane, polyfluorene, polydiacetylene, poly 2,5-thienylene, poly p-phenylene vinylene, hexithiopene, polythiopenes, oligothiophenes, phthalocyanines, polyacetylene, anthradithiophenes and other like organic materials. In one embodiment of the invention, pentacene is utilized as the organic semiconductor material. An organic semiconductor layer comprised of pentacene may be formed using a solution-processable precursor, thereby avoiding costly vacuum deposition techniques, as described in U.S. Pat. Nos. 6,963,080 and 7,125,989, each of which is incorporated herein by reference in its entirety for all purposes.

In one embodiment, the organic semiconducting material is a thin film material having a thickness of about 5 microns or less. More preferably, the organic semiconducting material has a thickness of from about 100 to about 1000 A.

The organic semiconducting material may be formed using conventional deposition processes that are well known in the art. For example, the organic semiconducting material may be formed by molecular beam deposition, vacuum evaporation, sublimation, spin-on coating, dip coating and other like deposition processes. Masking, selective deposition or other known techniques may be utilized to control the pattern, placement and arrangement of the organic semiconductor layers.

As mentioned above, the thin film transistors utilized in the examples of the present invention include a self-assembled monolayer that is formed on the surface of the electrodes prior to deposition of the organic thin film semiconductor. The self-assembled monolayer may be comprised of at least one organic compound that is effective in modifying the electrode surface such that the resulting electrode-organic semiconductor is rendered capable of realizing ambipolar transport. Thus, the organic compound(s) selected should be capable of enhancing charge injection at the metal-organic interface between the source and drain electrodes and the organic semiconductor. In one aspect of the invention, the organic compound may undergo a chemical reaction when contacted with the source and drain electrodes (for example, if the organic compound is a thiol, the thiol group may react with a metal on the surface of the electrode to form a thiolate containing a S-metal bond). The self-assembled monolayer of the examples of the present invention may comprise a sulfur-containing compound such as a thiol having the formula R—SH wherein R is a linear or branched, substituted or unsubstituted, alkyl, alkenyl, cycloalkyl or aromatic containing from about 2 to about 25 carbon atoms. When substituted, the substituent may, for example, be an alkyl having from 1 to about 3 carbon atoms, a halogen such as Cl, Br, F or I, hydroxyl, ammonium and other like substituents. Specific illustrative organic compounds useful in the examples of the present invention include benzenethiol, 4-nitrobenzenethiol, perfluorobenzenethiol, thiophenol, 4-amino thiophenol, 1H-pyridine-4-thione, ethanethiol, butanethiol, hexanethiol, 2-naphthalenethiol, 4-mercaptophenol, and 4-mercaptopyridine. Other suitable organic compounds useful for forming the desired self-assembled monolayer on the surfaces of the source and drain electrodes include, but are not limited to, other heteroatom-containing compounds such as thioketones, dithiolates, dithiocarbamates, selenols, amines and isocyanides (also known as isonitriles or carbylamines) as well as other sulfur- and nitrogen-containing compounds. Organic compounds containing heteroatoms such as S or N capable of binding to the metal(s) on the electrode surfaces (through, for example, covalent or coordinative bonds or other such interactions) are used in one embodiment of the invention. The heteroatom may be part of a functional group that appears at one end or terminus of the organic compound molecule. In another aspect of the invention, the organic compound contains at least one aromatic ring. In still another aspect of the invention, an organic compound containing at least one heteroatom and at least one aromatic ring is used to form the self-assembled monolayer; such an organic compound can be utilized in combination with an acene material such as pentacene as the semiconductor. The organic compound used to form the self-assembled monolayer may also be a carbene such as, for example, an N-heterocyclic carbene (e.g., a cyclic diaminocarbene).

In an example embodiment, a self-assembled monolayer is formed on the electrodes prior to deposition of the organic thin film semiconductor by subjecting the electrodes to a treatment process that is effective in forming a monolayer of the organic compound on the surface of the electrodes. Specifically, the monolayer may be formed by immersing the structure in an organic compound-containing solution. The treatment process may be carried out at a suitable temperature for a time period of from about 0.5 to about 24 hours. In some situations, treatment temperatures of room temperature or less may be advantageous. Depending upon the organic compound used, lower treatment temperatures may provide better ordering of the organic compound on the electrode surface. Elevated temperatures up to 70° C. can also be used as long as the elevated temperature does not adversely effect the various layers of the structure. The organic compound-containing solution may be a concentrated or dilute solution in which the organic compound is dissolved in a suitable solvent. In one embodiment of the present invention, a dilute solution containing from about 0.001 to about 0.01% by weight organic compound may be employed in forming the self-assembled monolayer.

After treatment with the organic compound, the structure may be removed from the organic compound-containing solution, rinsed with fresh solvent and dried. The organic semiconductor material is formed thereon. The drying step is typically conducted at a temperature of from about 25 to about 30° C. for a time period of from about 1 to about 5 minutes. Other temperatures and times are also contemplated herein.

If so desired, an insulator layer may be formed over the semiconductor layer using any suitable deposition or film-forming method. Any of the conventional dielectric materials known in the art may be utilized, such as organic dielectric materials including polyimides, polyamides, parylenes, polyacrylates or other polymers. The dielectric material could also be a spin-on glass (SOG), such as an inorganic type of silicate-based SOG or an organic (resin) type of siloxane- or polysilazane-based SOG, which can be applied so as to provide a planarized surface with a controlled thickness.

Thus, one aspect of the invention utilizes first and second organic thin film transistors each of which may be produced by a method comprising the steps of: 1) forming or providing a substrate; 2) depositing a gate electrode on the substrate and patterning it; 3) depositing a gate insulator; 4) depositing and patterning source and drain electrodes; 5) treating at least a portion or essentially all of the exposed surfaces of the source and drain electrodes with one or more organic compounds that will form appropriate self-assembled monolayers effective to render the transistor capable of realizing ambipolar transport; and 6) depositing an organic semiconductor.

Another aspect of the invention utilizes first and second organic thin film transistors each of which may be produced by a method comprising the steps of: 1) forming or providing a substrate; 2) depositing and patterning source and drain electrodes; 3) treating at least a portion or essentially all of the exposed surfaces of the source and drain electrodes with one or more organic compounds that will form appropriate self-assembled monolayers effective to render the transistor capable of realizing ambipolar transport; 4) depositing an organic semiconductor; 5) depositing a gate insulator; and 6) depositing and patterning a gate on the gate insulator.

The example electronic circuits of the present invention may be employed in a wide variety of end-use applications, including for example radio frequency identification (RFID) tags, displays and sensors as well as organic light emitting field effect transistors, implantable flexible electronics for physiological sensing and effecting, and organic photodetectors or any other circuitry in which CMOS transistors are employed.

EXAMPLES

Figure 4:
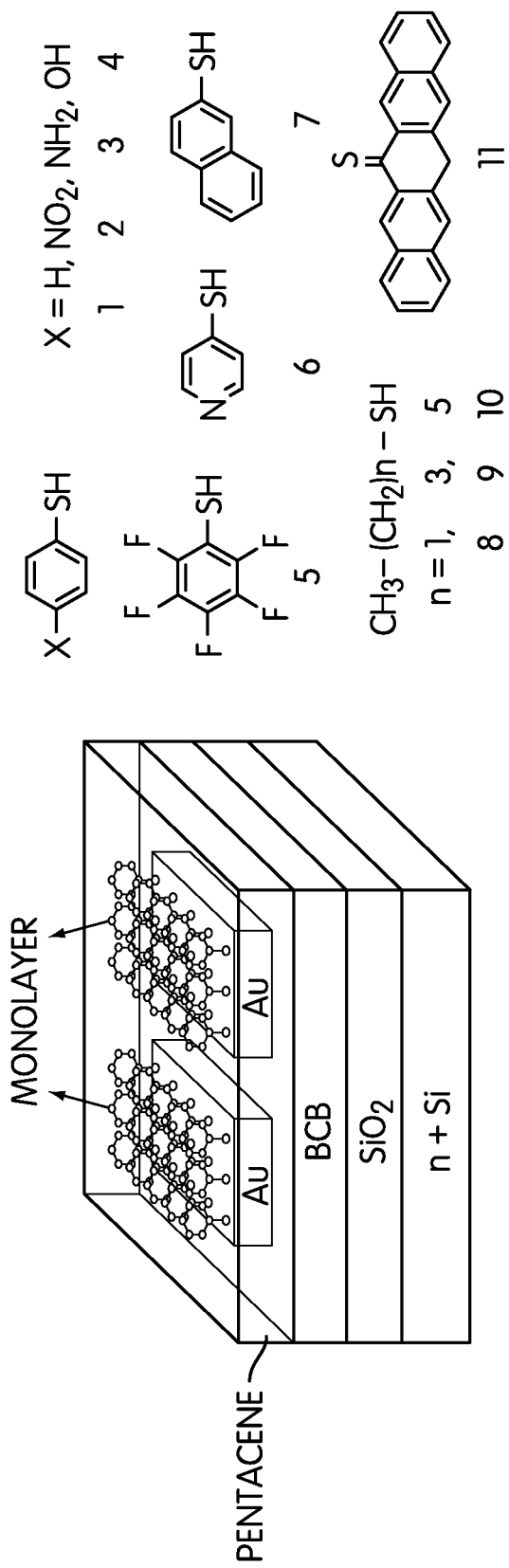
FIG. 4 illustrates in schematic form a field-effect transistor having bottom contact geometry that is useful in embodiments of the present invention, together with various organic compounds that may be employed to form self-assembled monolayers on the surfaces of the electrodes in such a device.

Pentacene FETs were fabricated in bottom contact geometry, as illustrated in FIG. 4. N-type Si wafers ($\rho$<0.01 $\Omega$-cm) with 250 nm thermally grown $SiO_2$ served as the back gate and part of the gate-dielectric stack of the FETs, respectively. The substrates were transferred into a $N_2$-glove box where all the device fabrication and characterization was performed. The wafers were cleaned by UV-ozone for 20 min. A 1:3 solution of BCB:mesitylene was filtered (0.2 µm polytetrafluoroethylene (PTFE) syringe filter), deposited by spin-coating at 3000 rpm for 30 s, and annealed at 265° C. for 30 s, providing a BCB (benzocyclobutene) layer about 130 nm thick. The measured capacitance of the $SiO_2$ (250 nm)/BCB (~130 nm) gate dielectric stack was 7.6($\pm$0.25) $nF/cm^2$. Au source and drain electrodes (15-20 nm in thickness) were thermally evaporated through a shadow mask to define channel lengths (L) ranging from 30-200 µm and widths (W) to provide W/L of 15 for each device.

Benzenethiol (1), 4-nitrobenzenethiol (2), 4-aminobenzenethiol (3), 4-sulfanylphenol (4), 2,3,4,5,6-pentafluorobenzenethiol (5), 1H-pyridine-4-thione (6), naphthalene-2-thiol (7), ethanethiol (8), butanethiol (9), and hexanethiol (10) were purchased from Sigma-Aldrich. Thioketone (11) was synthesized according to literature procedures. The structures of each of these organic compounds are shown in FIG. 4. The source and drain electrodes were derivatized from 10 mM solutions of monolayer-forming organic compounds 1-5 and 7-10 in toluene, 10 mM of 6 in ethanol, and 1 mM of 11 in tetrahydrofuran. The substrates were immersed in the organic compound monolayer forming solutions for 15-18 h, rinsed in the fresh parent solvent, and blown dry with $N_2$. A reference set of "unmodified" devices was prepared each time by immersing the devices in the parent solvent with no organic compound.

Pentacene was deposited by spin-coating and thermal conversion of its n-sulfinylacetamidopentacene precursor. The precursor was synthesized in-house according to literature procedures, or provided by IBM or Sigma-Aldrich. The precursor was dissolved in chloroform (15 mg/mL), filtered through a 0.2 µm PTFE syringe filter, and spun at 1500 rpm for 1 min. The precursor thin film was converted at 200° C. for 1 min to pentacene.

Figure 5:
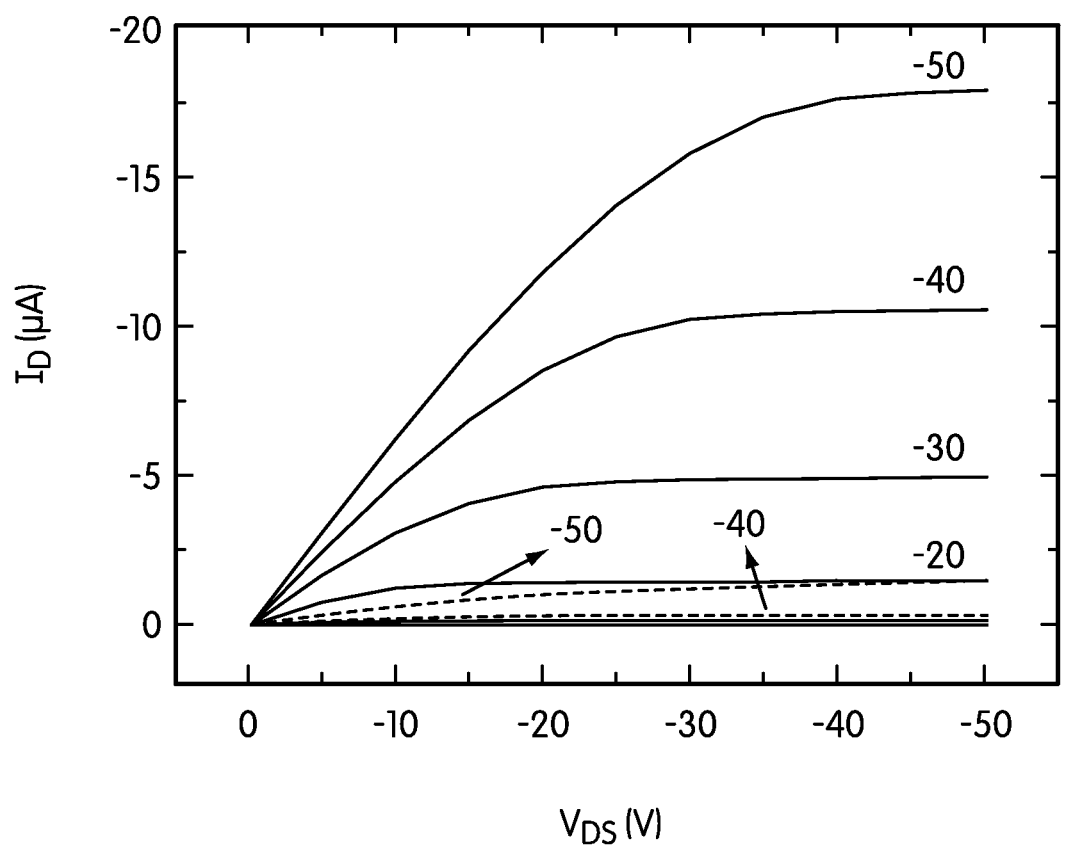
FIGS. 5-10 shows representative output and transfer characteristics for field-effect transistors containing gold electrodes modified with different self-assembling organic compounds, as described in more detail in the Examples.
Figure 6:
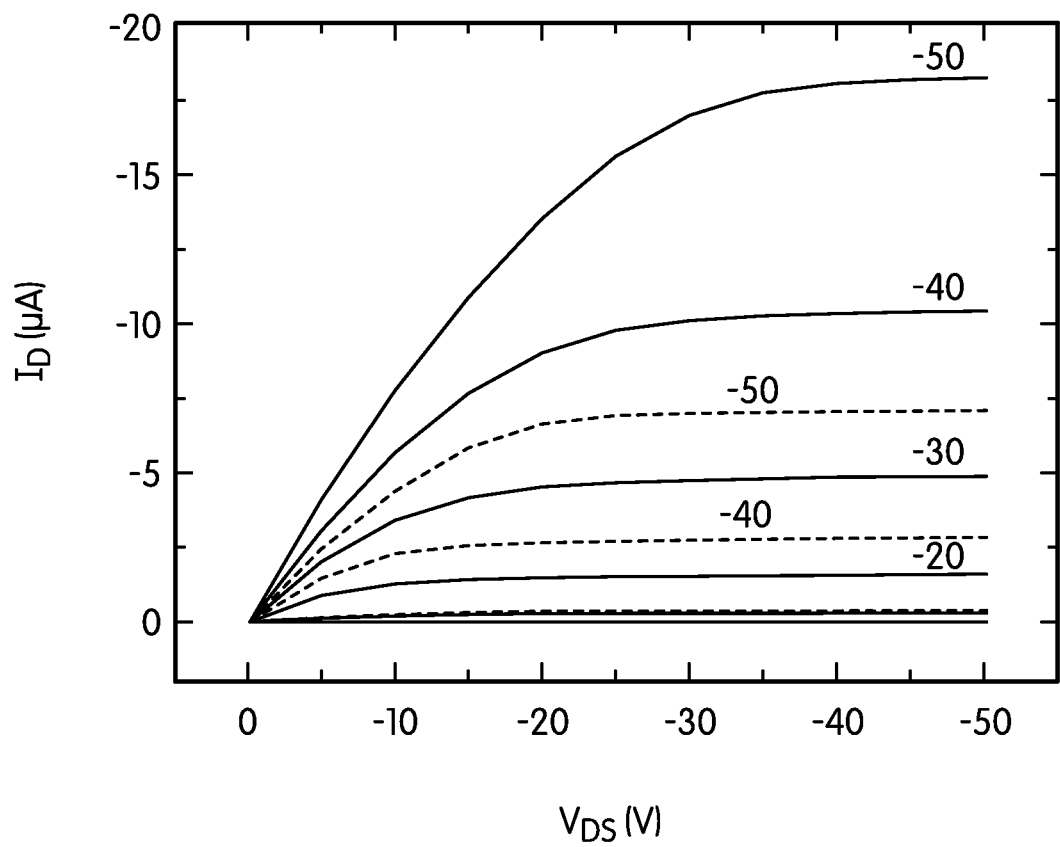
Figure 7:
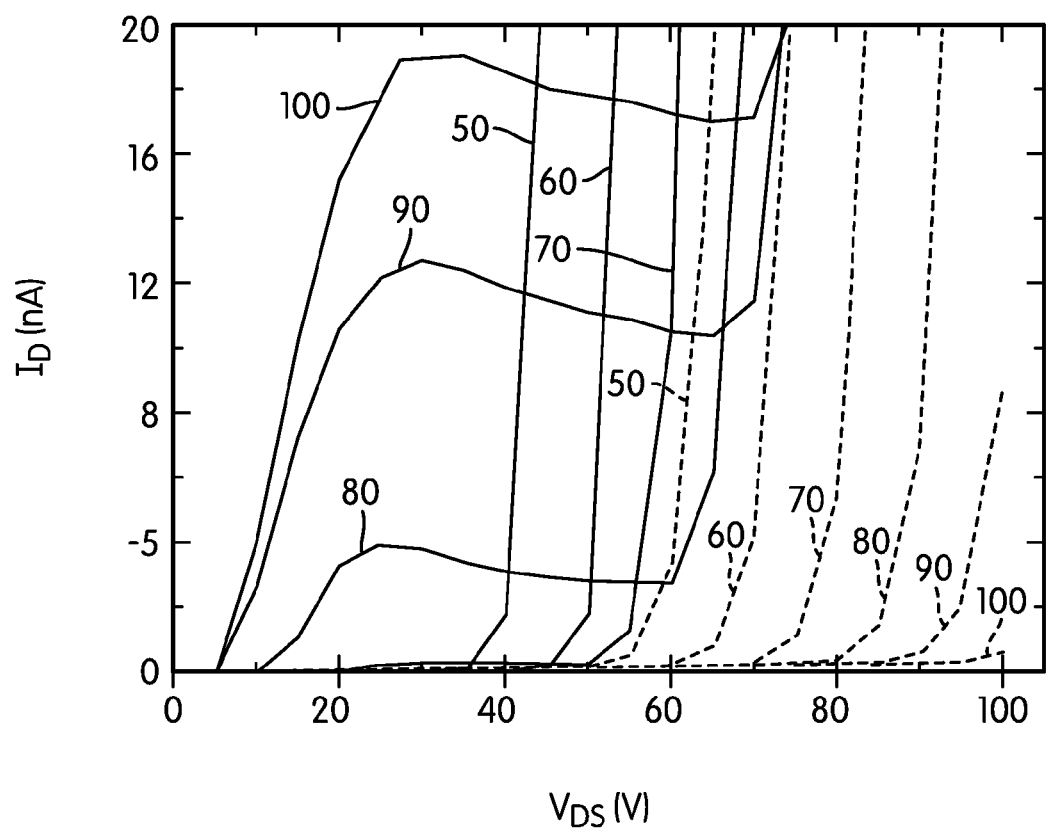
Figure 8:
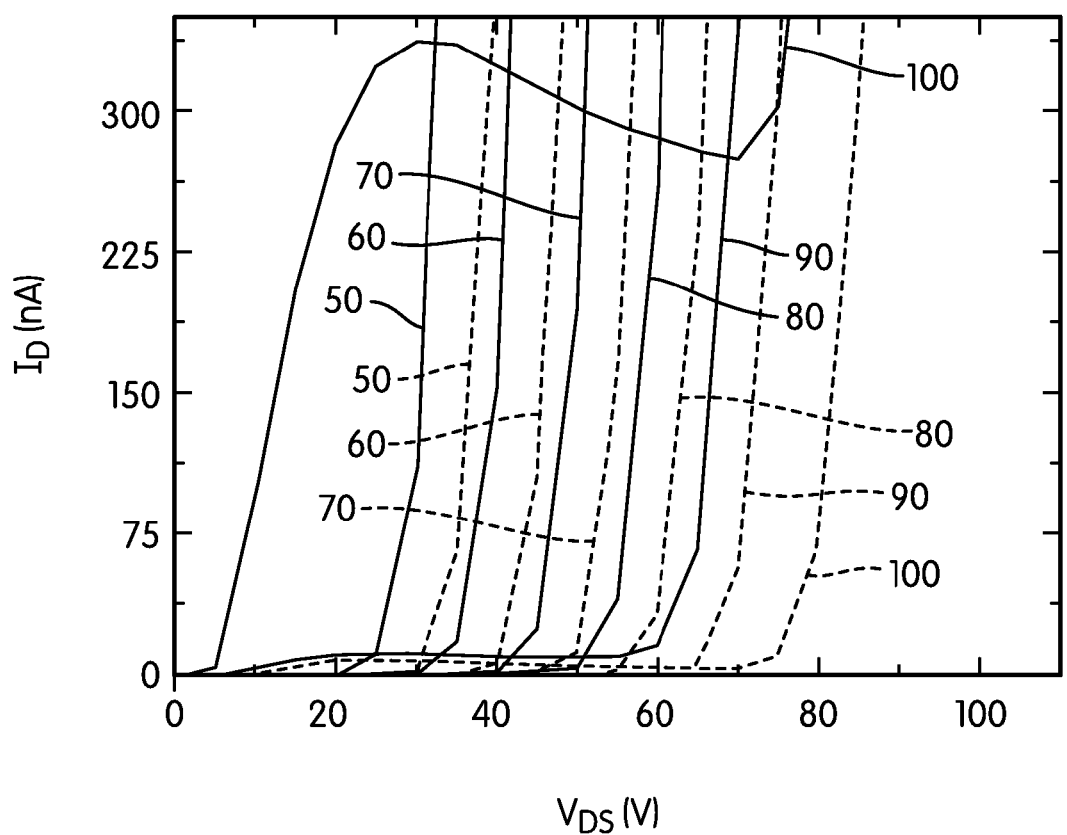
Figure 9:
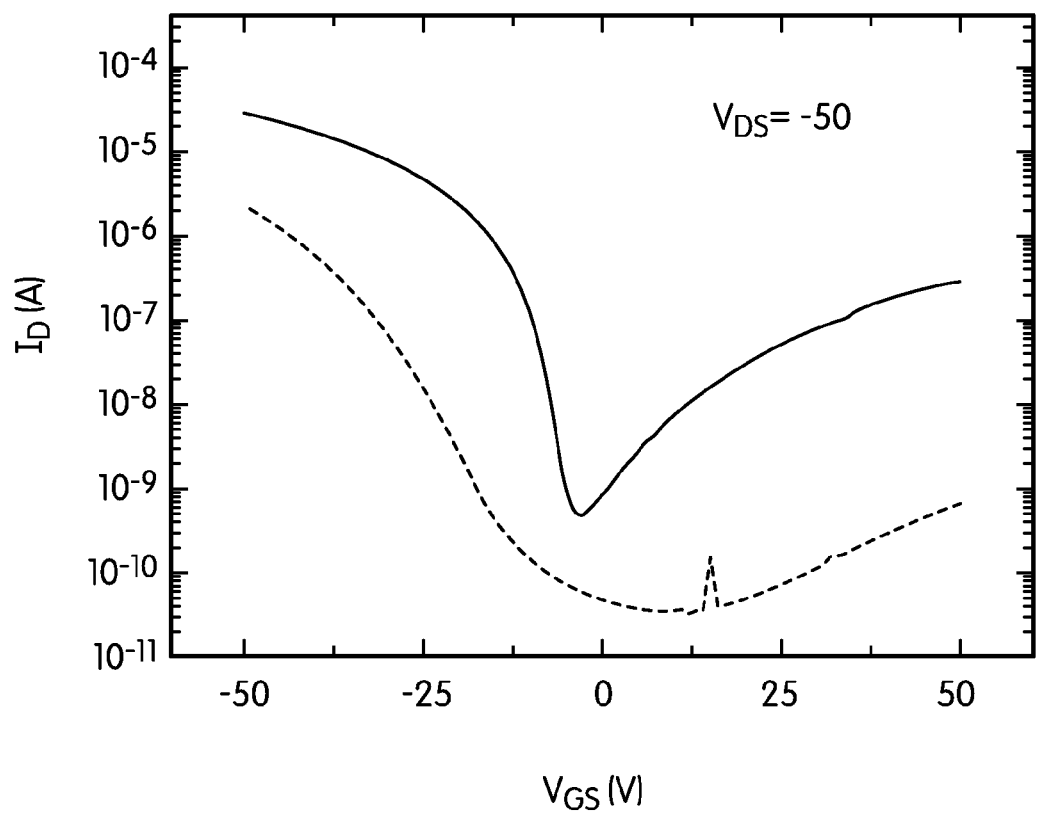
Figure 10:
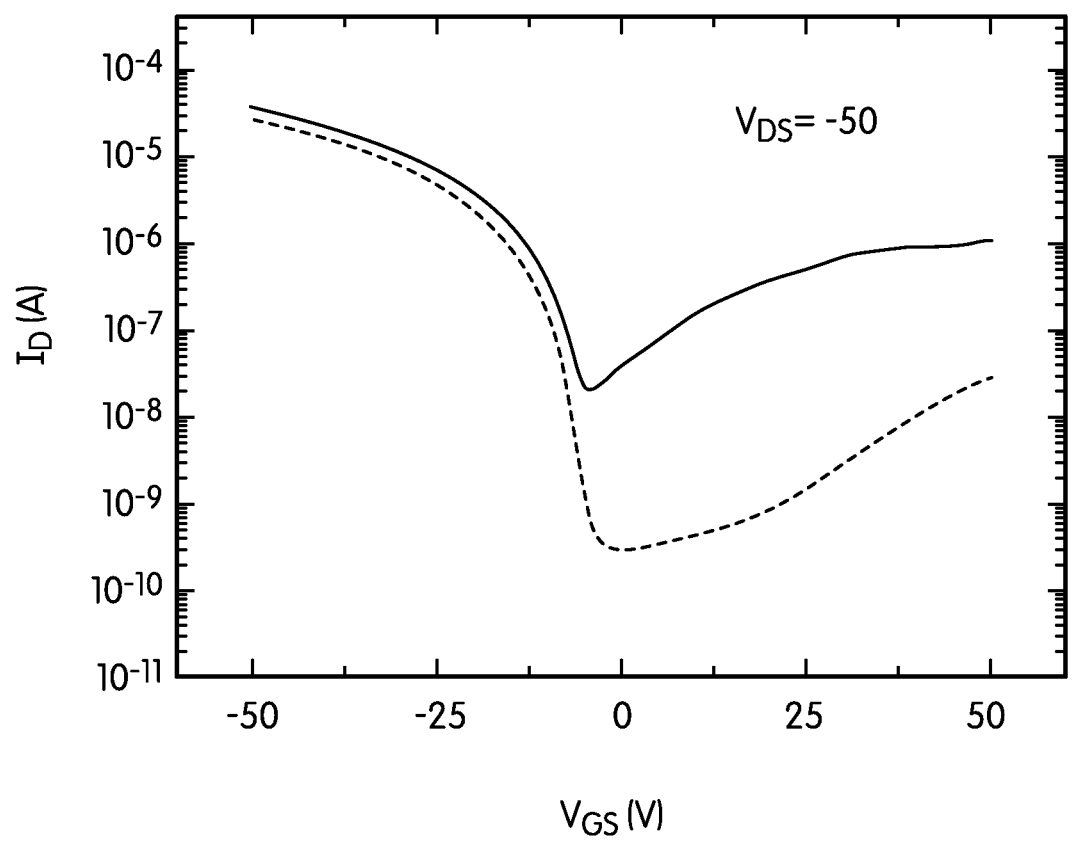

I-V characteristics of unmodified and modified devices were collected using a Karl Suss PM5 probe station in combination with an Agilent 4156C semiconductor parameter analyzer. FIGS. 5-10 show representative output and transfer characteristics (in solid lines) for pentacene FETs with benzenethiolate 1 modified electrodes (FIGS. 5, 7 and 9) and ethanethiolate 8 modified electrodes (FIGS. 6, 8 and 10). The output and transfer characteristics for pentacene FETs with non-modified electrodes, prepared side-by-side with the aforementioned pentacene FETs with modified electrodes are shown in FIGS. 5-10 in dotted lines. The channel lengths and widths of all the devices were 200 µm and 3 mm, respectively. Organic compounds 1 and 8 provide contrasting examples of aromatic and aliphatic monolayers. $I_D$-$V_{DS}$ characteristics at high negative $V_{GS}$ in FIGS. 5 and 6 show hole accumulation, while at high positive $V_{GS}$ in FIGS. 7 and 8 show electron accumulation characteristic of p-channel and n-channel organic FETs. At lower positive $V_{GS}$ and high $V_{DS}$, hole accumulation under the drain contact contributes significantly to transport in the channel. $I_D$-$V_{GS}$ (FIGS. 9 and 10) characteristics clearly show ambipolar transport in the solution-deposited pentacene FETs. The drain current in both the hole accumulation and electron accumulation regimes is dramatically improved in devices modified with either organic compound 1 or 8 compared to devices with unmodified electrodes. $I_D$-$V_{DS}$ data for unmodified devices, reflective of the ID-VG curves (FIGS. 9 and 10) show lower hole (FIGS. 5 and 6) and little to no electron currents (FIGS. 7 and 8). The saturation mobility for holes was 0.1-0.5 $cm^2$/V s and for electrons was 0.05-0.1 $cm^2$/V s for organic compound 1 and 8 modified devices. The threshold voltage for hole conduction was −15 to −30 V for unmodified electrodes and −1 to −10 V for the thiolate modified electrodes. The threshold voltage for electron conduction was 80-90 V for the thiolate modified electrodes.

All monolayer chemistries using organic compounds 1-11 showed significant improvement in both the hole and electron currents. While there was device-to-device variation in the electron and hole on currents, there was no observable systematic variation in on current with the dipole or electron-withdrawing or electron-donating nature of the compounds that would be anticipated to affect the metal work function. Atomic force microscopy and scanning electron microscopy images show the solution-deposited precursor route to pentacene forms thin films with the same observable morphologies both in the channel and at the electrode interface for all of the monolayer chemistries as with unmodified electrodes, suggesting that the thin film structure even at the electrodes is not substantially affected by the surface modification. The only systematic observation was a decrease in on current, with an increase in length of the aliphatic thiols. This same trend in length was not observed in comparing aromatic thiols 1 and 7. Our measurements suggest within our device-to-device variations that the sulfur-gold bond may govern charge injection and act to pin the Fermi level.

Figure 11:
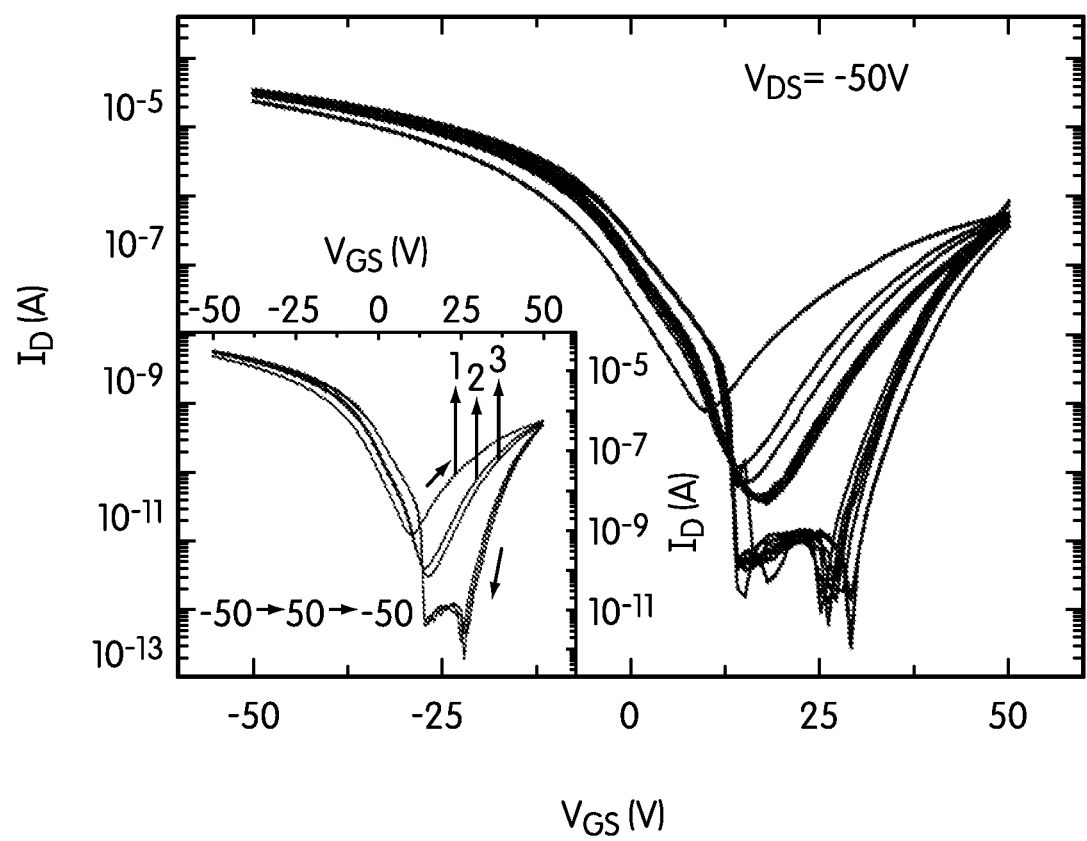
FIG. 11 shows the hysteresis loop formed by the forward and reverse transfer characteristics of a device containing thiolate-modified electrodes, as described in more detail in the Examples.

FIG. 11 shows the hysteresis loop formed by the forward (−50 V→+50 V→−50 V) and reverse (+50 V→−50 V→+50 V) transfer characteristics of a non-encapsulated device with organic compound 8 modified electrodes. The device was cycled from −50 to +50 to −50 V three times (inset), then from +50 to −50 to +50 V (three times) and then again −50 to +50 to −50 V (three times). All nine accumulated curves are shown. The hysteresis depends on applied $V_{GS}$ and becomes more hysteretic as $V_{GS}$ is increasingly positive, independent of the sweep direction. The reverse transfer characteristics consistently show greater current modulation and subthreshold slope for both the electron and hole branches and an increased carrier depletion region. The $I_D$-$V_{GS}$ characteristics shift in voltage with cycling, FIG. 11 (inset), but become more stable with each cycle, independent of sweep direction. The loop shifts back to its initial state when the device is left idle for a few hours indicating a limited carrier retention time. Little hysteresis is observed when the voltage was swept in only the hole or electron accumulation region. The hysteresis is consistent with electron traps in pentacene or at the pentacene-dielectric interface. As observed for many ambipolar organic FETs, while the hole current remains stable in air ambient, electron transport is not air stable.

Figure 12:
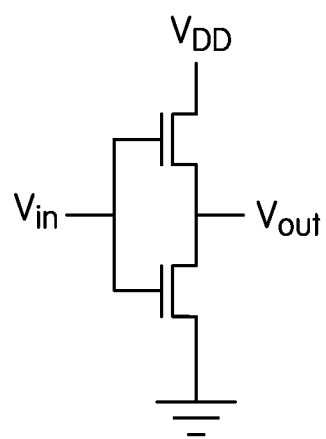
FIG. 12 shows, in schematic form, an inverter circuit which can be constructed in accordance with the present invention.
Figure 13:
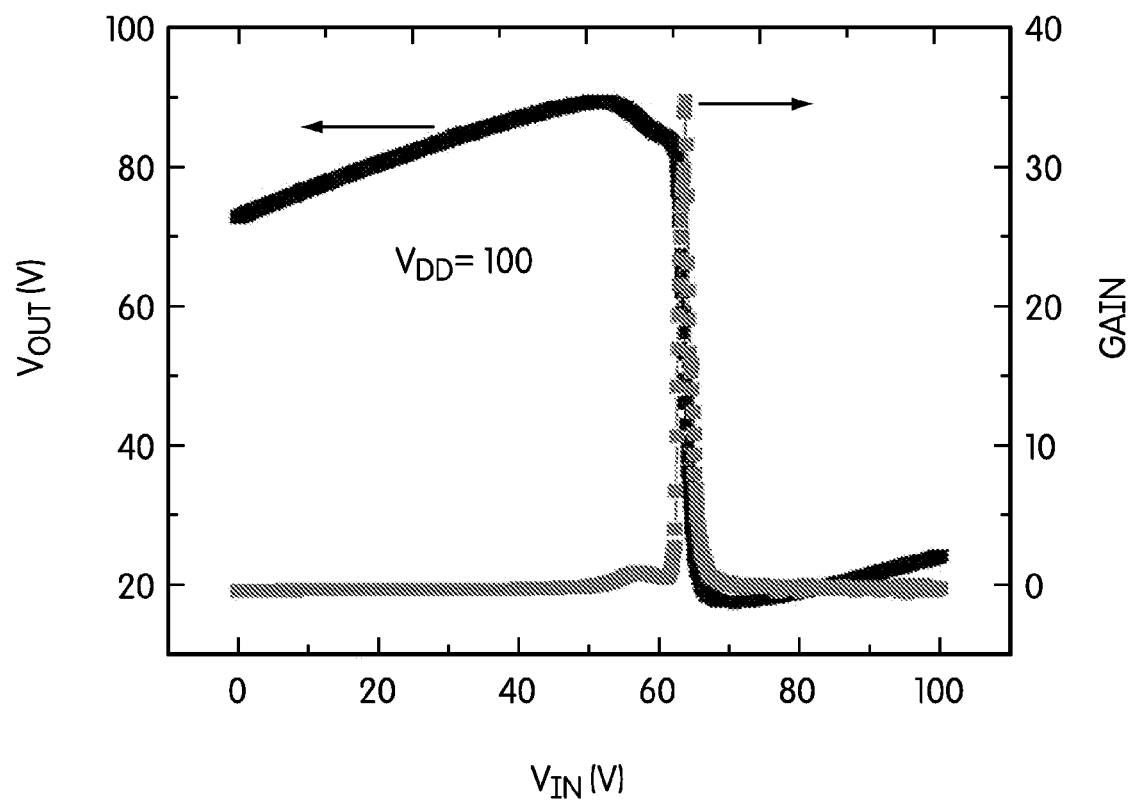
FIGS. 13-16 show the transfer characteristics at positive and negative supply voltage for FETs with organic compound-modified electrodes in accordance with the invention, as explained in more detail in the Examples.
Figure 14:
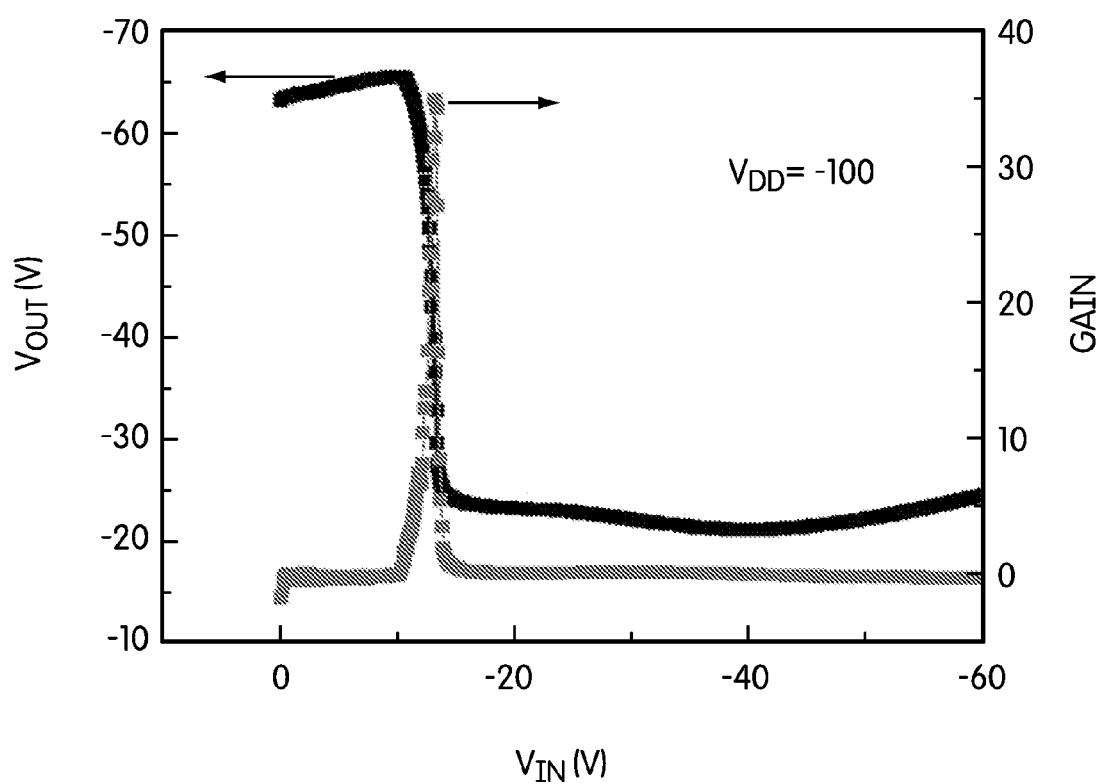
Figure 15:
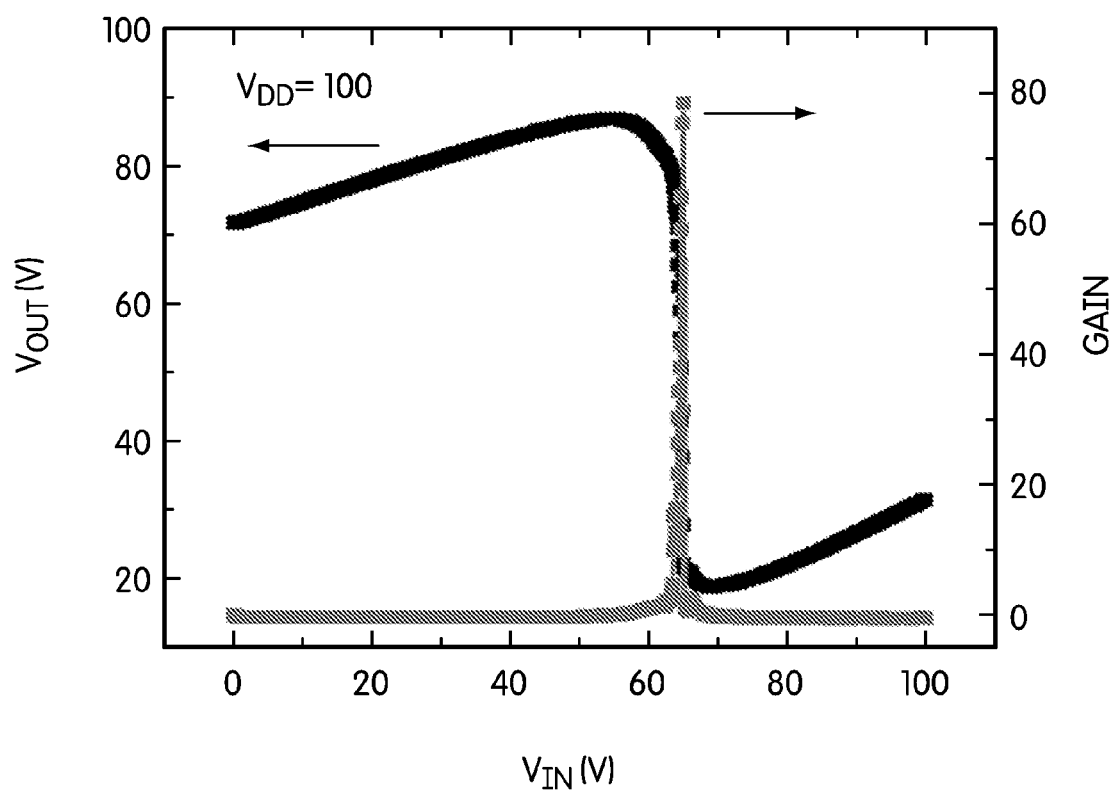
Figure 16:
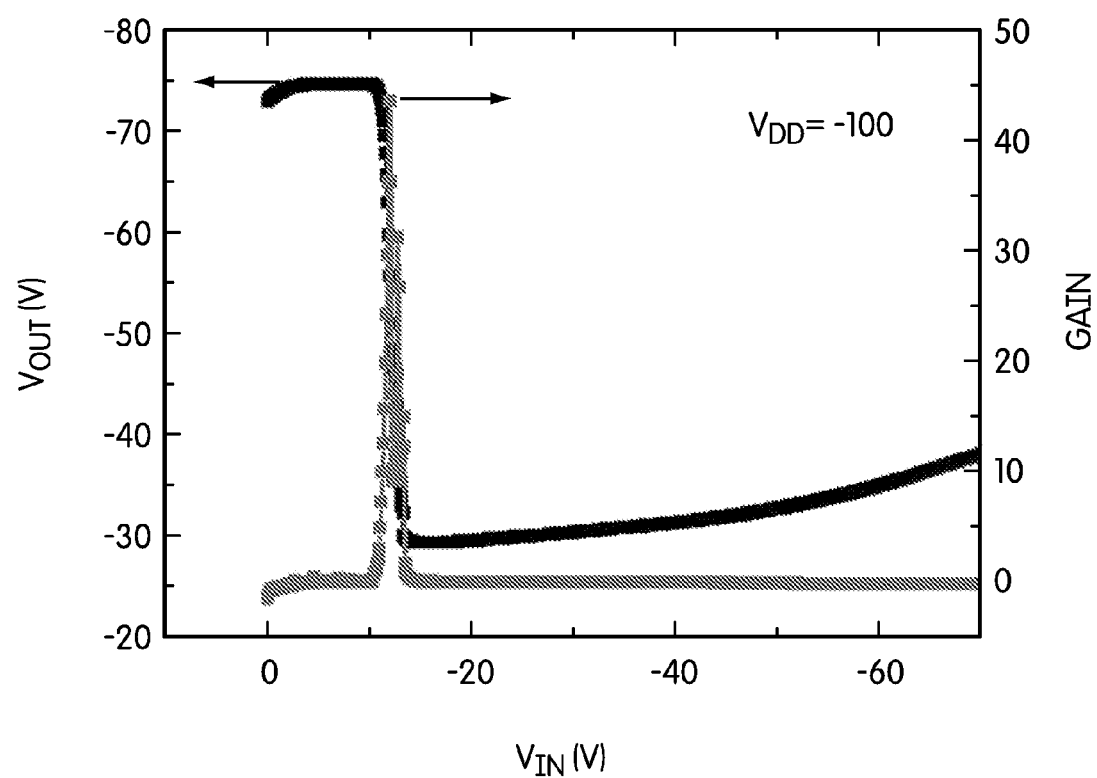

Using the ambipolar FETs achieved by chemically modifying the device electrodes and using the BCB/$SiO_2$ dielectric stack, bottom contact inverters were fabricated from the solution-processable precursor route to pentacene, employing the Si wafer as a common gate. FIG. 12 shows in schematic form the inverter circuit used in the example. A typical inverter circuit includes two transistors, one pmos and one nmos. The pmos transistor is typically indicated by a circle on the gate at the connection point. Because the transistors in FIG. 12 are ambipolar, both transistors are shown as nmos transistors with the understanding that one of the transistors may be configured to be a pmos transistor. FIGS. 13-16 show transfer characteristics at [FIGS. 13 and 15] positive supply voltage (VDD) and [FIGS. 14 and 16] negative supply voltage ($V_{DD}$) for FETs with [FIGS. 13 and 14] 1 and [FIGS. 15 and 16] 8 modified electrodes. The inverter shows typical voltage transfer characteristics with low-to-high input voltage driving high-to-low output voltage with gain of 35/35 for positive/negative $V_{DD}$ for organic compound 1 modified devices and gain of 79/43 for positive/negative $V_{DD}$ for organic compound 8 modified devices. The slope in the transfer characteristics at high and low input voltage arises from the ambipolar nature of the FETs which are never truly off as in conventional CMOS. While FIG. 13-16 show the characteristics of inverters containing 1 and 8 modified electrodes, many high gain inverters (with gains of up to 94) were fabricated using the various monolayer chemistries explored. These gains exceed previously published reports of single component inverters.

What is claimed is:
1. An electronic circuit comprising a first organic thin film transistor and a second organic thin film transistor which are operatively connected and provided on a common substrate, wherein each of said first organic thin film transistor and said second organic thin film transistor includes bottom source/drain electrodes having an organic semiconductor formed over said bottom source/drain electrodes, wherein each of said bottom source/drain electrodes has a self-assembled monolayer formed thereon, said self-assembled monolayer comprising at least one organic compound which is a thiol or mixture of thiols, and wherein said first organic thin film transistor and said second organic thin film transistor exhibit ambipolar transport such that one of said first and second transistors is configured as a pmos transistor and the other one of said first and second transistors is configured as an nmos transistor.

2. The electronic circuit of claim 1 wherein said organic semiconductor is comprised of pentacene.

3. The electronic circuit of claim 1 wherein said organic compound is an aromatic thiol or mixture of aromatic thiols.

4. The electronic circuit of claim 1 wherein said organic compound is selected from the group consisting of benzenethiol, 4-nitrobenzenethiol, perfluorobenzenethiol, thiophenol, 4-amino thiophenol, 1H-pyridine-4-thione, ethanethiol, butanethiol, hexanethiol, 2-naphthalenethiol, 4-mercaptophenol, and 4-mercaptopyridine.

5. The electronic circuit of claim 1 wherein said bottom source/drain electrodes are comprised of one or more metals selected from the group consisting of gold, platinum, palladium, aluminum, tungsten, chromium, silver and titanium.

6. The electronic circuit of claim 1 wherein the first and second organic thin film transistors additionally include a gate insulator.

7. The electronic circuit of claim 1 wherein the first and second organic thin film transistors additionally include a gate electrode formed on the gate insulator opposite the organic semiconductor material.

8. The electronic circuit of claim 1 wherein said substrate is an Si-containing substrate, a glass substrate or a plastic substrate.

9. The electronic circuit of claim 1 wherein said bottom source/drain electrodes are in contact with a polymer gate dielectric.

10. The electronic circuit of claim 1 wherein said bottom source/drain electrodes are in contact with a polymer gate dielectric comprised of benzocyclobutene.

11. The electronic circuit of claim 1 wherein the same organic semiconductor is used in both the first organic thin film transistor and the second organic thin film transistor.

12. The electronic circuit of claim 1 wherein the organic compound is a heteroatom-containing organic compound.

13. The electronic circuit of claim 1 wherein the organic compound is an organic compound containing at least one heteroatom selected from the group consisting of S and N.

14. The electronic circuit of claim 1, wherein each of the first organic thin film transistor and the second organic thin film transistor comprise a source region and a drain region, with a channel layer extending between the source region and the drain region and a gate region disposed in spaced adjacency to the channel layer between the source region and the drain region, and a self-assembled monolayer comprised of at least one organic compound, disposed adjacent to the source region and the drain region, wherein the channel region includes an organic semiconductor material and an electrically insulating layer is present between the gate region and the channel layer.

15. The electronic circuit of claim 1, wherein the bottom source/drain electrodes contain a single conductive material.

16. The electronic circuit of claim 15, wherein the single conductive material is gold.

17. The electronic circuit of claim 1, wherein the bottom source/drain electrodes contain only gold and are in contact with a polymer gate dielectric comprised of benzocyclobutene, the organic semiconductor is pentacene, and the at least one organic compound is a thiol.

* * * * *

UNITED STATES PATENT AND TRADEMARK OFFICE
CERTIFICATE OF CORRECTION

PATENT NO. : 8,686,404 B2  Page 1 of 1
APPLICATION NO. : 13/133189
DATED : April 1, 2014
INVENTOR(S) : Kagan et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 246 days.

Signed and Sealed this

Twenty-ninth Day of September, 2015

Michelle K. Lee
*Director of the United States Patent and Trademark Office*